United States Patent
Angerame et al.

(10) Patent No.: US 7,215,109 B2
(45) Date of Patent: May 8, 2007

(54) ELECTRIC POWER USAGE AND DEMAND REPORTING SYSTEM

(75) Inventors: Richard A. Angerame, Saddle River, NJ (US); David J. Harroun, Wales, WI (US); Kathleen Lorio, Port Jefferson, NY (US); C. Robert Tanoff, East Moriches, NY (US)

(73) Assignee: Utility Programs and Metering, Inc., New York, NY (US)

( * ) Notice: Subject to any disclaimer, the term of this patent is extended or adjusted under 35 U.S.C. 154(b) by 0 days.

(21) Appl. No.: 11/051,036

(22) Filed: Feb. 4, 2005

(65) Prior Publication Data

US 2006/0001414 A1    Jan. 5, 2006

Related U.S. Application Data

(60) Provisional application No. 60/542,802, filed on Feb. 6, 2004.

(51) Int. Cl.
*G01R 19/30*    (2006.01)

(52) U.S. Cl. .................................. 324/103 R
(58) Field of Classification Search ............. None
See application file for complete search history.

(56) References Cited

U.S. PATENT DOCUMENTS

| | | | |
|---|---|---|---|
| 4,216,384 A | 8/1980 | Hurley | |
| 5,930,773 A | 7/1999 | Crooks et al. | |
| 6,088,688 A | 7/2000 | Crooks et al. | |
| 6,327,541 B1 * | 12/2001 | Pitchford et al. | .............. 702/62 |
| 6,519,509 B1 * | 2/2003 | Nierlich et al. | ............. 700/286 |
| 6,553,418 B1 | 4/2003 | Collins et al. | |
| 6,618,709 B1 | 9/2003 | Sneeringer | |
| 6,622,097 B2 | 9/2003 | Hunter | |
| 6,681,154 B2 * | 1/2004 | Nierlich et al. | ............... 702/60 |
| 6,728,646 B2 | 4/2004 | Howell et al. | |
| 6,819,098 B2 * | 11/2004 | Villicana et al. | .......... 324/158.1 |
| 6,867,707 B1 * | 3/2005 | Kelley et al. | .................. 702/62 |
| 2002/0198629 A1 | 12/2002 | Ellis | |
| 2003/0009401 A1 | 1/2003 | Ellis | |
| 2003/0052542 A1 | 3/2003 | Hashimoto et al. | |
| 2003/0120370 A1 | 6/2003 | Kitayama et al. | |
| 2004/0006439 A1 | 1/2004 | Hunter | |
| 2004/0024717 A1 | 2/2004 | Sneeringer | |
| 2004/0078154 A1 | 4/2004 | Hunter | |
| 2004/0174071 A1 * | 9/2004 | Nierlich et al. | ................ 307/11 |
| 2004/0186672 A1 | 9/2004 | Howell et al. | |
| 2005/0096857 A1 | 5/2005 | Hunter | |

* cited by examiner

*Primary Examiner*—Jermele Hollington
(74) *Attorney, Agent, or Firm*—John J. Horn

(57) ABSTRACT

An electric power usage and reporting system for collecting electric power demand readings from multiple properties which may be either commonly owned or leased by the same company, processing the demand data to generate KWH and KW information on an individual property basis and on a combined properties basis and generating a report including the KWH usage and KW demand information. The report includes information on electric power KWH usage and KW demand in the aggregate and with respect to each property and includes information on coincident KW demand in the aggregate and with respect to each property.

25 Claims, 5 Drawing Sheets

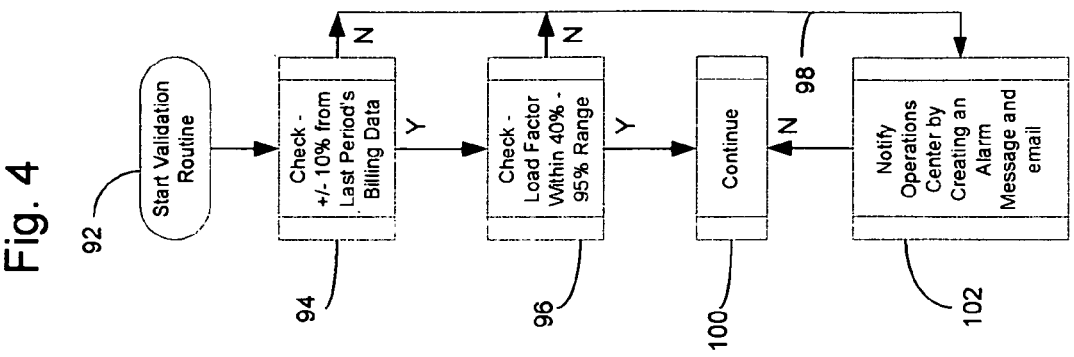
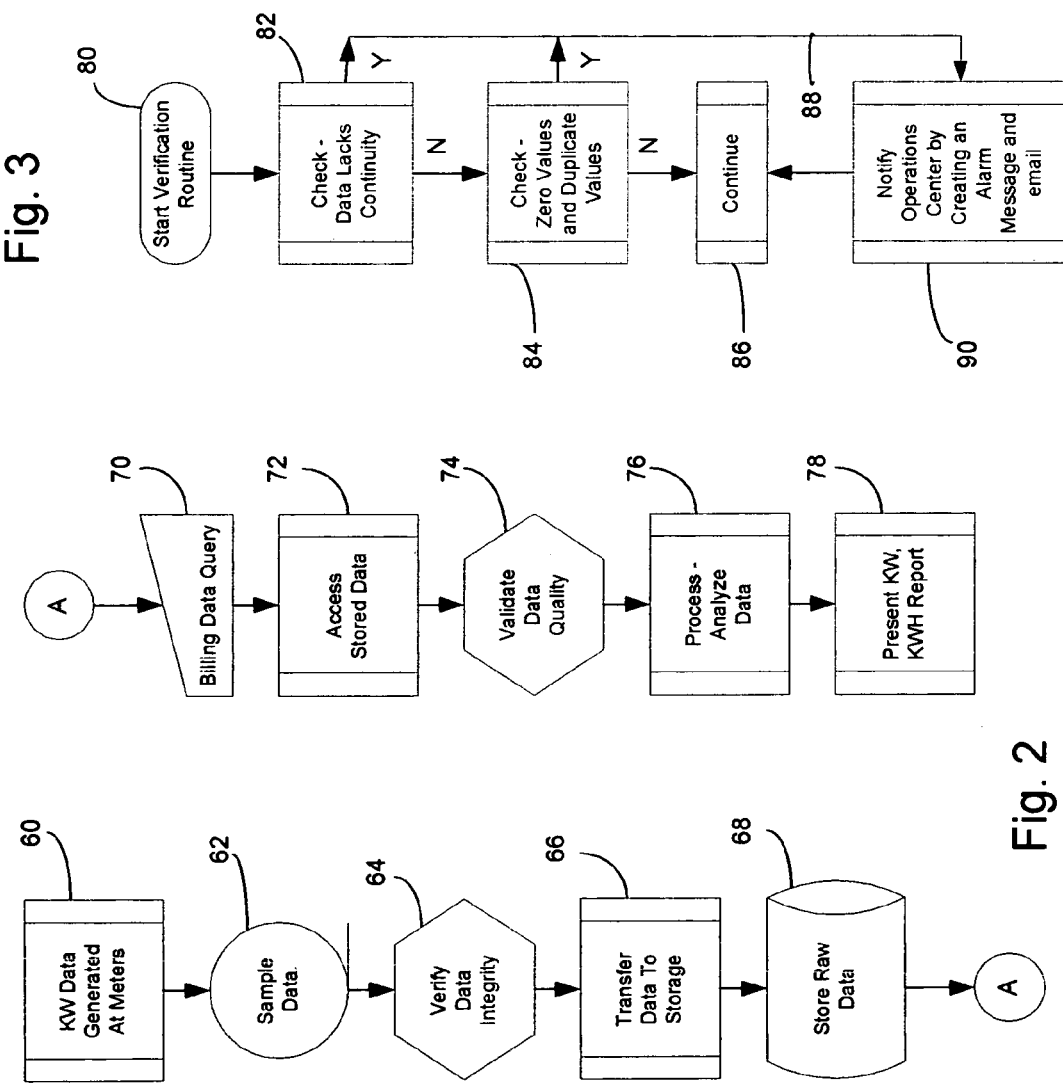

Fig. 7

| Tenant/Owner | Billing Period | | ELECTRIC POWER USAGE AND DEMAND REPORT | | | Location/Meter Specific Data | | | | |
|---|---|---|---|---|---|---|---|---|---|---|
| | | | Aggregate Data | | | | | | | |
| | Start Date | End Date | Maximum KW Total | Coincident KW Total | Location | OnPeak KWH | OffPeak KWH | Maximum KW | Coincident KW Bldg | Load Factor |
| ABC Corp. 1 | 12/05/04 | 01/06/05 | 84.4 | 79.4 | 390-55 | 874.1 | 682.1 | 6.0 | 4.4 | 33.77% |
| ABC Corp. 2 | 12/05/04 | 01/06/05 | 84.4 | 79.4 | 390-56 | 1883.8 | 2025.9 | 9.0 | 8.4 | 56.56% |
| ABC Corp. 3 | 12/05/04 | 01/06/05 | 84.4 | 79.4 | 390-57 | 2261.1 | 1896.5 | 10.4 | 10.0 | 52.12% |
| ABC Corp. 4 | 12/05/04 | 01/06/05 | 84.4 | 79.4 | 390-58 | 998.7 | 929.9 | 5.6 | 5.0 | 44.84% |
| ABC Corp. 5 | 12/05/04 | 01/06/05 | 84.4 | 79.4 | 120-12 | 6261.5 | 4434.5 | 24.4 | 23.0 | 57.08% |
| ABC Corp. 6 | 12/05/04 | 01/06/05 | 84.4 | 79.4 | 120-13 | 1684.2 | 1385.5 | 7.6 | 7.6 | 52.59% |
| ABC Corp. 7 | 12/05/04 | 01/06/05 | 84.4 | 79.4 | 168-01 | 5504.9 | 5921.5 | 21.4 | 21.0 | 69.52% |
| AGGEGATE TOTALS | 12/05/04 | 01/06/05 | ----- | ----- | ALL | 19,468.3 | 17,275.9 | 84.4 | 79.4 | AV-52% |

ELECTRIC POWER USAGE AND DEMAND REPORTING SYSTEM

RELATED APPLICATIONS

This application claims the benefit of U.S. provisional application No. 60/542,802 filed Feb. 6, 2004, which is incorporated herein by reference in its entirety.

BACKGROUND OF THE INVENTION

The field of the present invention comprises electric power usage and demand monitoring and billing and more particularly the reporting of electric power usage and demand in support of electric power industry billing practices.

Most commercial or industrial properties have electric power meters that monitor and record KW demand according to sliding windows or intervals that are commonly 15 minutes in length and are subject to electric utility tariffs or billing structures for power that include charges over the billing period for On-Peak usage in KWH (Kilowatt Hours) typically from 10 AM to 9 PM weekdays not including holidays and charges for Off-Peak usage in KWH at other times. In more and more cases separate demand charges or surcharges are also included with respect to maximum coincident KW (Kilowatt) demand during the billing period or with respect to the coincident KW demand of the customer occurring at the time of either the building peak demand or system peak demand for the utility company service area during the billing period.

Furthermore, electric power is frequently sub-metered to tenants in large buildings, or commercial or industrial complexes where the tenants have multiple separately metered leaseholds or properties and the terms of leases usually establish coincident demand charges. In such cases the electric power usage and demand measured by each of the meters is usually aggregated over the multiple properties held by each tenant since this provides an advantage to the tenants result of the diversity of demand represented by the different properties. Electric power billing charges related to demand peaks and coincident demand are becoming increasingly important in the electric power industry and important concern in situations where tenants or owners hold multiple separately metered pr sub-metered properties in the same building or utility service area.

However, it is currently difficult to track electric power usage and demand across multiple properties and efficiently account for coincident demand on a consolidated basis with respect to multiple properties despite the fact that reporting of usage and demand on a consolidated or aggregate basis may benefit tenants, owners and utility companies.

SUMMARY OF THE INVENTION

The present invention provides a system for acquiring, storing, analyzing, and reporting electric power usage and demand information. Electric power demand data comprising KW readings over regular intervals is collected by a device server on a regular basis from electric power interval meters at different locations representing usage and demand at different commonly owned or leased premises. The demand data from the meters is transferred to and stored by a database server in a central database form where it can be readily accessed when needed. A presentation server includes and runs an electric power usage and demand application program for processing the data in response to reporting inquiries. Users may log onto the presentation server from their own computer systems and request a billing period report. When a report is requested the presentation server runs the application in response to tenant, owner or property information furnished by the user.

Under direction of the electric power usage and demand application program the presentation server retrieves the applicable demand data for the properties of the tenant or owner or the properties designated by the user from the database. The integrity of the demand data is verified by checking for continuity gaps, missing entries and duplicate entries. If local billing practices require the use of contiguous demand data the data is processed to transform it into the required contiguous demand KWc readings. The data for all the indicated properties is then aligned or synchronized to a set of standard metering intervals. The demand data is then processed to generate power usage information including On-Peak and Off-Peak KWH sums by property and in the aggregate over all the properties of the owner or tenant or properties designated by the user for the indicated billing period. The demand data is then further processed by adding together the demand readings for each property with respect to each interval in order to generate aggregate demand data representing consolidated demand across all of the tenant's or owner's properties or the user designated properties by interval for the billing period. The time, date and amount of the maximum aggregate coincident demand occurring at any time during the billing period is then identified and the readings for each property contributing to that demand maximum KW total are identified.

If the properties are subject to coincident demand charges with reference to the demand maximum for the building they are located in or the utility company service area in which they are located, the time and date of the building or system demand maximum is acquired either from a main building meter in the case of building demand or over the internet from the utility company. The program identifies the aggregate coincident demand KW total across all the indicated properties for the time and date of the building or system demand maximum and the readings for each property contributing to that demand maximum KW total are identified.

Thereafter, a report is generated for the user as a browser window listing the properties, the On-Peak and Off-Peak KWH readings by property and in the aggregate, the maximum coincident aggregate demand total and the readings contributing to it by property and if applicable the coincident demand KW (or KWc) total with reference to the time and date of the maximum building or system demand and the readings for each property contributing to that demand total. The report is furnished to the user for viewing using a web browser window from his computer which may be logged onto the presentation from a remote location.

It is an object of the present invention to provide a system for reporting electric power usage and demand information including coincident demand information in support of power and demand billing practices to assist in billing and in the understanding of electric power usage and demand parameters.

It is another object of the present invention to provide a system for reporting electric power usage and demand information across multiple properties owned by the same company and across multiple properties leased by the same company in situations where electric power is being separately sub-metered to the owners or tenants with respect to each property.

It is another object of the present invention to provide a system for reporting electric power usage and demand information which reports information for multiple linked properties both on a consolidated basis and broken out with respect to each property and shows coincident demand totals both in the aggregate and according to the contributions of individual properties.

BRIEF DESCRIPTION OF THE DRAWINGS

FIG. 2 provides a flowchart showing the steps in the flow of information across the overall electric power usage and demand system shown in FIG. 1 with respect to the operation of the present invention.

FIG. 3 provides a flowchart showing the steps in verifying the integrity of demand information collected in accordance with the present invention.

FIG. 4 provides a flowchart showing the steps in validating the quality of demand information collected in accordance with the present invention.

FIG. 7 provides a sample report in accordance with the principles of the present invention showing KWH and KW demand information across multiple properties both by property and in the aggregate and showing aggregate coincident demand information in total and by property.

DETAILED DESCRIPTION

Figure 1:
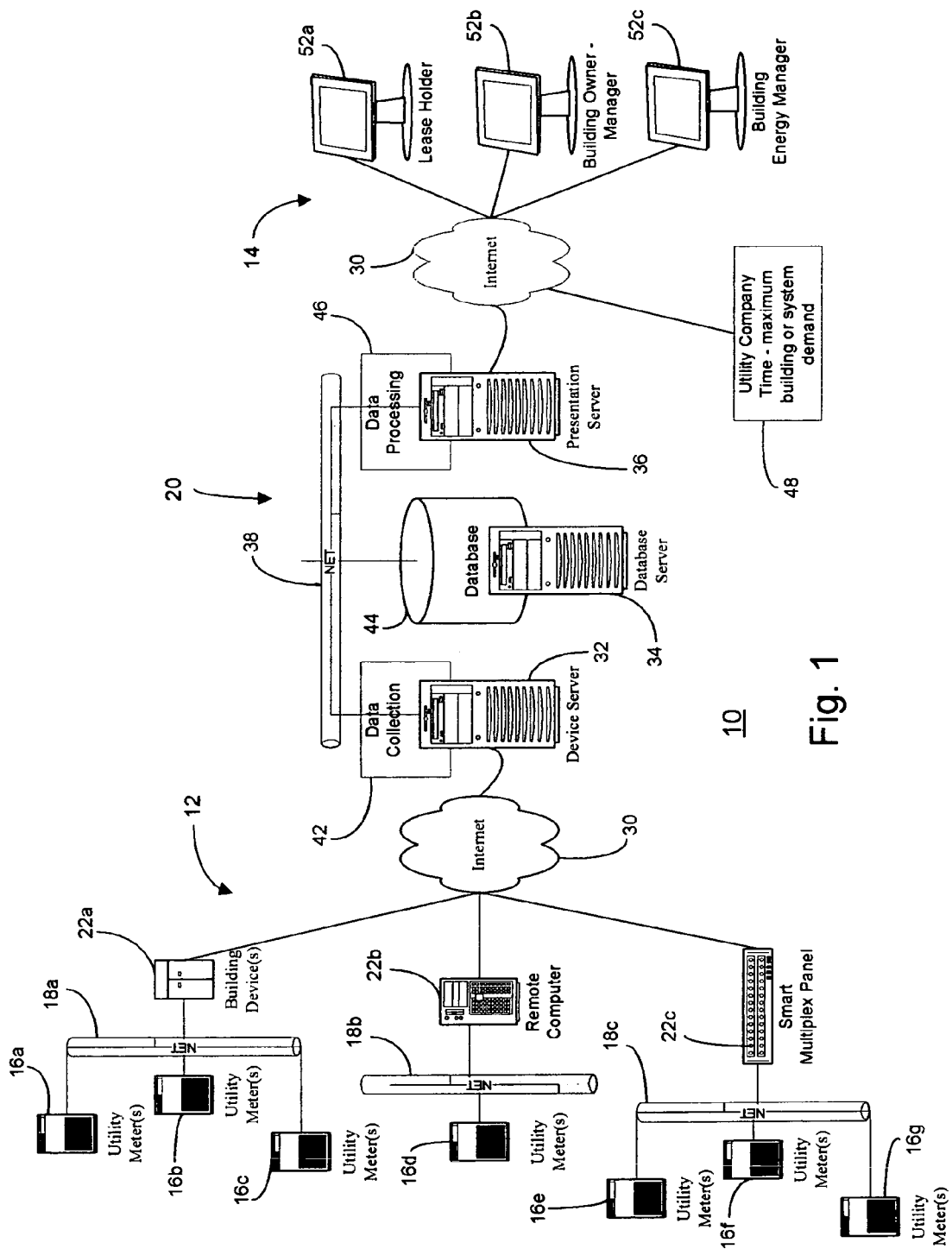
FIG. 1 provides a block diagram of the overall electric power usage and demand system within which the present invention operates.

Referring now to FIG. 1, the electric power usage management system 10 includes a data acquisition subsystem 12, a computing center 20 and a reporting subsystem 14. The data acquisition subsystem 12 acquires electric power readings from electric power meters at different properties and in different buildings. The computing center 20 stores and processes the data represented by these readings and presents a consolidated report of key KW and KWH values including aggregate values for sets of linked properties such as commonly owned or leased properties. The reporting subsystem 14 encompasses the computer systems of the different parties having interests in the properties and its power usage and provides for access to the reports furnished by the computing center 20.

The data acquisition system 12 includes electric power meters and sub-meters 16a–g, building intranets 18a–c, and service equipment 22a–c. The meters and sub-meters 16a–g are interval demand meters recording electric demand in Kilowatts (KW) preferably on 15 minute intervals although other intervals such as 5, 10, 30 minute intervals may be employed. The electric meters and sub-meters 16a–g preferably have built in network communications capabilities but may include automated meter reading (AMR) devices that provide automated readings and communications. The building intranets 18a–c represent communications networks coupled to the meters and sub-meters 16a–g within separate buildings that may have varying capabilities but in this case allow for the raw KW data to be collected and reported to or through the building service equipment 22a–c. In most cases the service equipment 22a–c comprise computer servers such as remote computer 22b operating as gateways to and from the internet 30 and the electric meters and sub-meters 16a–g. However, the service equipment 22a–c may include a wide variety of devices furnishing the required communications between the meters and sub-meters and the internet 30 such as building control modules or smart multiplex panels 22c, or automation equipment like power monitoring devices or programmable logic controllers 22a or one or more of the electric meters or sub-meters (not shown) configured for direct communications over the internet 30.

The computing and data processing center 20 includes a device server 32, a database server 34 and a presentation server 36. The device server 32 runs a communications program for collecting data from the various components of the data acquisition system 14 and provides for the secure transfer of KW readings from the points at which they are available to the database 44 on a regular periodic basis. The KW readings are transferred by the device server 32 to the database 44 maintained by the database server 34 where these readings are stored in their raw form pending their use in supporting the preparation of electric utility bills which normally occurs at the end of each billing period established by the utility or as otherwise established by lease in the case of building tenants. The presentation server 36 runs an analysis and reporting software program 46 that fetches KW readings from the database 44 in response to user inquiries specifying the owners, tenants or properties the user has an interest in and then analyzes this data to generate one or more reports which can to accessed over the internet using a web browser subject to password security. These reports provide on-peak and off-peak KWH summations, maximum KW demand values for individual properties, maximum aggregate coincident KW conjunctively occurring demand across commonly owned or leased properties, and aggregate coincident KW demand in accordance with the timing of maximum building wide demand or maximum system demand for diversified properties located in different buildings but within the same utility service area.

The reporting sub-system 14 comprises independent computers 52a, 52b and 52c configured for access over the internet 30 to the reports furnished from the presentation server 36. Using a web browser on one of the computers 52a, 52b or 52c a building occupant or lease holder or building owner or energy manager can view and use the reported KW and KWH usage and demand information provided by the reports in understanding, formulating and responding to their electrical power bills.

Referring now to FIG. 2, the flow of information across the system 10 from the electric meters 16a–g to the end user computers 52a, 52b and 52c. In accordance with step 60 raw KW demand data is generated at electric power meters and sub-meters 16a–g. This data is then sampled and collected in step 62 by the device server 32 and the integrity of the data is verified in step 64 as conforming to minimum standards. Thereafter in step 66 the raw KW demand data is transferred to the database server 34 and stored in step 66 by the server 34 in the database 44 pending later use. In accordance with step 70 whenever a billing inquiry is initiated by a user of the electric power usage management system and information is entered at one of the computers 52a–c specifying a property, properties, property owner or tenant, the raw KW demand data is accessed in step 72 by the presentation server 36 from the database 44 maintained by the database server 34. The quality of the KW demand data is then checked in step 74 as conforming to minimum standards and thereafter the data is analyzed and processed in step 76 in order to generate a report showing the key KWH and KW demand information presented to the user in the final step 76 at one of the computer systems 52*a–c*.

Referring now to FIG. 3, the raw KW demand data is verified in accordance with step 64 by the verification routine starting at point 80. First, the KW data is checked in step 82 to assure that data is not missing and continuity exists between sequential contiguous sampling intervals. If the data lacks continuity, the routine jumps along path 88 to step 90 at which an alarm is set to notify the operations center for manual intervention to address the problem which may or may not turn out to be important. Otherwise, the routine passes on to step 84 at which the KW data is checked for zero values and duplicate values. If zero values or duplicate data are detected, the routine jumps again along path 88 to step 90 at which an alarm is set to notify the operations center for manual intervention to address the problem which again may or may not turn out to be important. Assuming the data checked out as conforming to the minimum integrity standards in step 84 or after an alarm is set in step 90 the processing of the KW data proceeds on to step 66 in accordance with the normal flow of system operations.

Referring now to FIG. 4, the KW demand data is validated in accordance with step 74 by the validation routine starting at point 92. First, the KW data is checked in step 94 to assure that data is not out of bounds and is within reasonable limits, for example +/−10%, from the last comparable billing period's data. If the data is not within specified limits, the routine jumps along path 98 to step 102 at which an alarm is set to notify the operations center for manual intervention to address the problem which may or may not turn out to be important. Otherwise, the routine passes on to step 96 at which the KW data is checked to see that as a whole its load factor is within a normal range of, for example, 40%–95%. If the load factor is outside normal range, the routine jumps again along path 98 to step 102 at which an alarm is set to notify the operations center for manual intervention to address the problem which again may or may not turn out to be important. Assuming the data checked out as conforming to the minimum quality standards in step 96 or after an alarm is set in step 102 the processing of the KW data proceeds on to step 76 in accordance with the normal flow of system operations.

Figure 5:
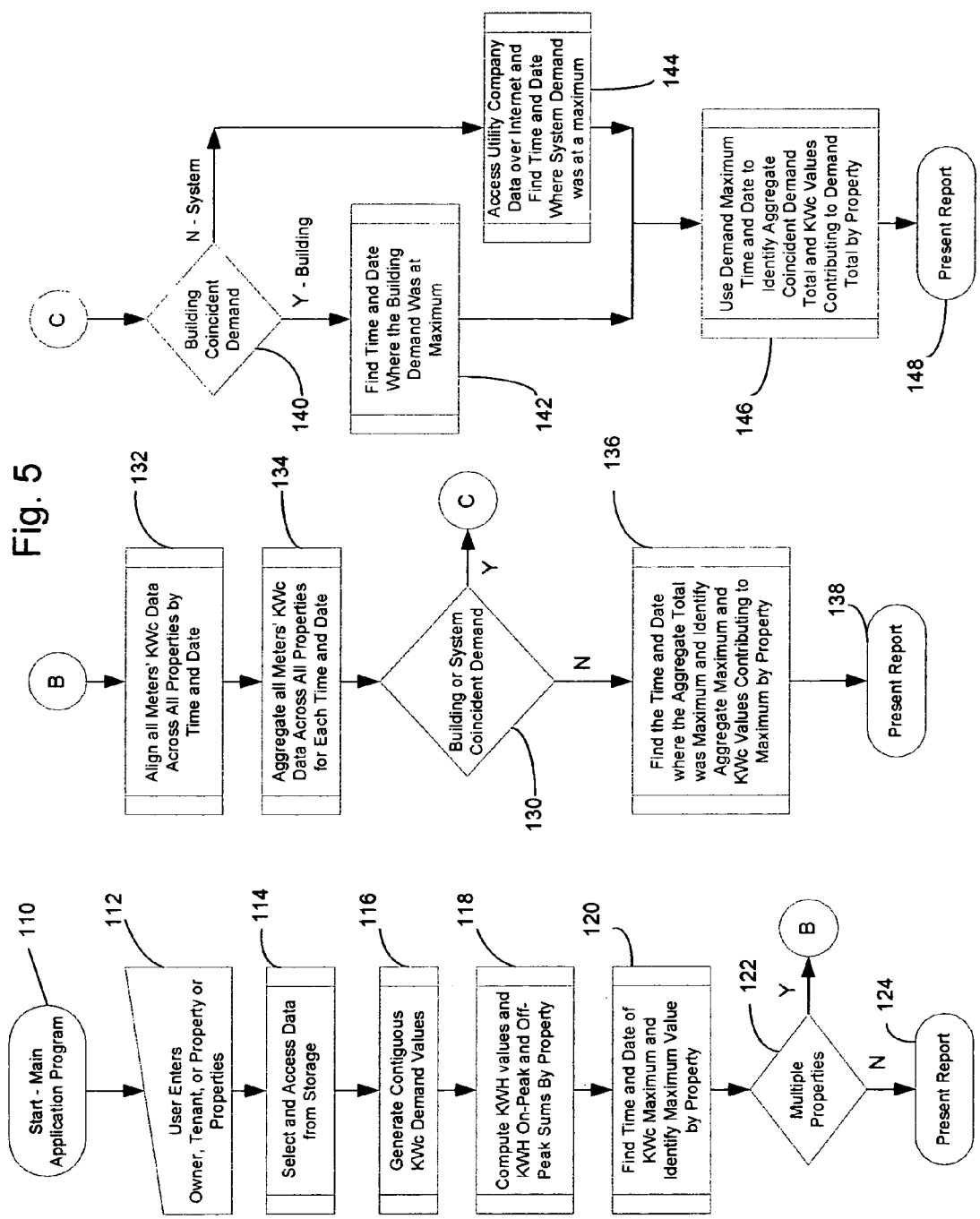
FIG. 5 provides a flowchart showing the steps in the processing of the demand data by the electric power usage and demand application program of the present invention as a part of preparing a user report.

Referring now to FIG. 5, the KW demand data is processed in accordance with step 76 by the electric power usage management system starting at point 110. In step 112 a system user at one of the computers 52*a–c* initiates a billing information inquiry and enters data specifying a particular property or properties, owner or tenant. Thereafter, in step 114 the required KW data for the properties, owner's properties or tenant's properties is selected, accessed and retrieved from the server 34 and database 44. Contiguous KW demand data (KWc) is then generated in step 116 by averaging the 15 minute interval data over 30 minute contiguous periods including the interval itself and these values are retained as the working KWc values for further calculations. It should be noted that it is only necessary to compute contiguous KW values in the case of billings with respect to certain utility companies such as Consolidated Edison in New York and this step is therefore not necessary or desirable in many cases. In step 118 the KWH sums for on-peak and off-peak periods are generated by combining the 15 minute KWc demand data over hourly periods (by summing the sets of four quarter hour components together and dividing by 4) and by summing the resulting hourly values over the entire billing period for each property. Thereafter, in step 120 the time and date of the KWc maximum over the entire billing period is determined and the corresponding maximum KWc value identified for each property.

In step 122 the program branches based on whether multiple properties are involved. If a single property has been specified then the program terminates at point 124 with the presentation of a report including the on-peak and off-peak KWH sums and the maximum KWc values over the billing period for the single property involved. If multiple properties are involved the program moves to step 132 in which the KWc demand data is aligned or synchronized across all the properties for all the time interval and dates during the billing period by comparing the time stamps associated with the data to a set of standard intervals for the billing period and associating all the KWc demand data with respect to all the properties with the standard intervals. Aggregate KWc demand values are then generated in step 134 by adding together the aligned KWc values for the different properties for each 15 minute interval to produce new KWc sums for all the intervals over the billing period.

In step 130 the program again branches based on whether or not the properties are subject to either building coincident demand billing or system coincident demand billing. In the case of building coincident demand billing demand charges may be based on the KWc values and aggregate totals for the properties (within the building) at the time of the KWc maximum for the entire building. In the case of system demand billing demand charges are based on the KWc values and aggregate totals for the properties at the time of the KWc maximum for an entire utility company service area. If building or system wide coincident demand billing is not involved the program moves to step 136 in which the time and date of the aggregate maximum KWc demand total over all the linked properties is determined and the corresponding maximum KWc value across all the properties as well as the KWc values of the individual properties conjunctively contributing to the maximum demand total are identified. The program then terminates at point 138 with the presentation of a report including the on-peak and off-peak KWH sums and the maximum aggregate KWc coincident demand total over the billing period for the properties involved and the KWc values for each property contributing to the total.

If building or system wide coincident demand billing is involved the program moves to step 140 in which it further branches based on whether the properties are subject to building coincident demand billing in one case or system coincident demand billing in the other. If the properties are subject to building coincident demand billing the program moves to step 142 in which the time and date of the building KWc maximum is determined by downloading this information over the internet from the utility company or collecting this information from the building meter. Alternately, if the properties are subject to system coincident demand billing the program moves to step 144 in which the time and date of the system KWc maximum is determined by downloading this information over the internet from the utility company or calling the utility company. In both cases the time and date of the demand maximum is used in step 146 to identify the corresponding KWc totals for the same time and date across all the properties as well as the KWc values of the individual properties contributing to this demand total. The program then terminates at point 148 with the presentation of a report including the on-peak and off-peak KWH sums and the aggregate KWc coincident demand total over the billing period for the properties involved at the time of either building or system demand maximum and the KWc values for each property contributing to this coincident demand total.

Figure 6:
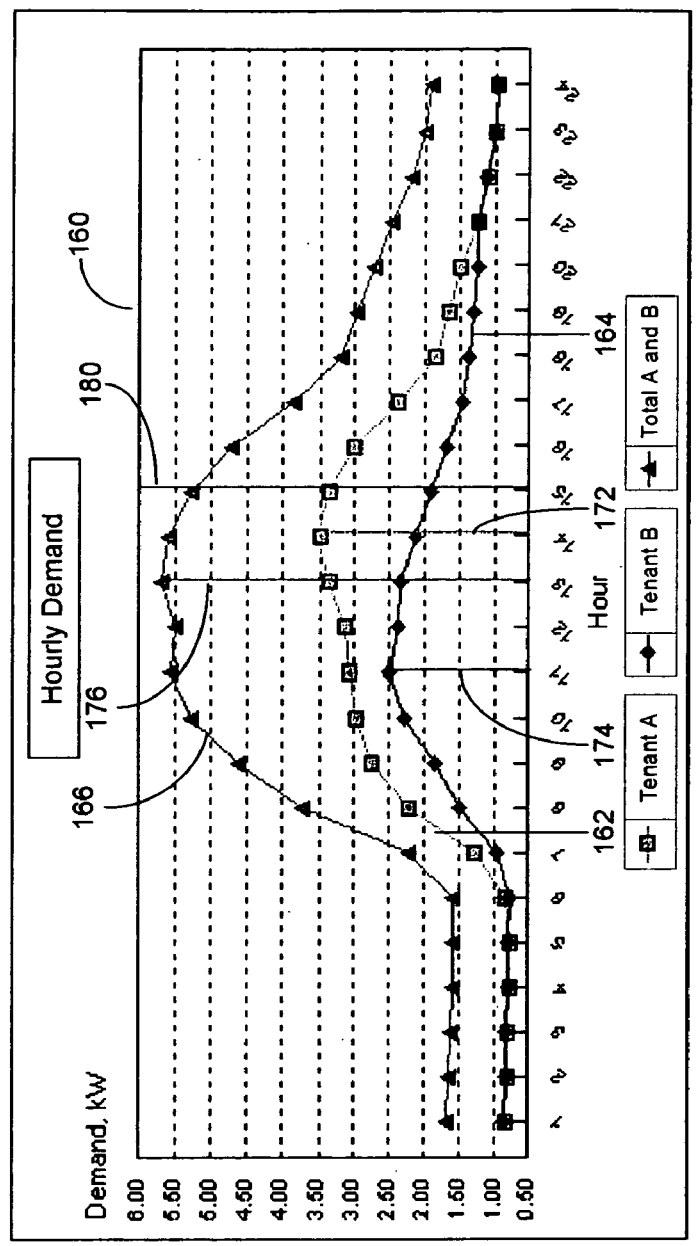
FIG. 6 provides a graph showing demand readings with respect to two linked properties illustrating the concepts underlying aggregate coincident demand.

Referring now to FIG. 6, the graph 160 illustrates the concept of coincident demand over a 24 hour period with respect to two commonly owned tenants or customers A an B having separate tenancies and separate electric power meters but whose charges are billed to a common parent company account. The plot 162 represents hourly KW demand by tenant A. The plot 164 represents hourly KW demand by tenant B. The plot 166 represents the combined aggregate hourly KW demand by tenants A and B. The vertical lines denote specific power usage and events related to billing occurring during the day. The line 172 denotes the time of maximum KW demand for tenant A occurring at 2 PM and indicates a maximum demand level of 3.50 KW. The line 174 denotes the time of maximum KW demand for tenant B occurring at 11 AM and indicates a maximum demand level of 2.00 KW. The line 176 denotes the time of maximum combined or aggregate KW demand across both properties for tenants A and B occurring at 1 PM and indicates a maximum aggregate KW demand level of 5.70 KW. The line 180 denotes the time of the maximum system demand in the utility company's service area where the properties are located occurring at 3 PM and resulting in an aggregate coincident KW demand total (occurring at 3 PM) of 5.28 KW with tenant A's property contributing 3.37 KW of demand and tenant B's property contributing 1.91 KW of demand. The total of each tenant's peak KW demand independent of time or in other words the non-coincident demand would have been 6.00 KW (3.5+2.5).

Referring now to FIG. 7, an electric power usage and demand report is shown constituting a table 200 having a set of rows corresponding to different properties having a common link such as being owned or leased by the same company and having a set of columns detailing various usage and demand information by property and in the aggregate. The first column 202 shows the tenant or owner name and a property designation which corresponds with a location-meter number shown in column 214. It should be noted that in this case all the listed properties are in the same building and subject to coincident building wide demand maximum billing charges.

The two columns generally shown at 204 provide the start and end dates for the billing period. The two columns generally shown at 206 provide aggregate data applying to all properties including maximum aggregate KW totals in column 210 and aggregate coincident KW totals in column 212. Five columns generally indicated at 208 provide location specific data. In alignment with the locations designated in column 214, column 216 supplies On-Peak KWH sums by property and column 218 supplies Off-Peak KWH sums by property. Column 220 provides KW values by property contributing to the maximum KW aggregate demand total across all the properties. Column 222 provides KW values by property contributing to the aggregate coincident KW demand total across all the properties at the time and date of the building maximum demand during the billing period. Load factor statistics are supplied by property in column 224. Finally, row 230 at the bottom of the table 200 supplies aggregate totals applying across the listed properties including the total On-Peak KWH, Off-peak KWH, maximum KW total, coincident KW total at building maximum KW demand, and average load factor across the listed properties.

Although the invention has been described with reference to certain embodiments for which many implementation details have been described, it should be recognized that there are other embodiments within the spirit and scope of the claims and the invention is not intended to be limited by the details described with respect to the embodiments specifically disclosed. For example, the invention is not intended to be limited to handling contiguous (KWc) demand values or KW values only based on 15 minute intervals.

The invention claimed is:

1. An electric power usage monitoring and reporting process, comprising the steps of:
   a) acquiring raw power usage and demand data including KW readings recorded on periodic intervals from electric interval power meters located at a plurality of commonly owned or leased properties;
   b) transmitting and storing this raw data at a central location remote from said meters;
   c) processing said raw data over a standard billing period after the close of the billing period by:
      (i) computing contiguous KW values for all the intervals in said billing period for all said electric power meters across all said properties,
      (ii) computing KWH values from the KW values and summing KWH values over said billing period for on-peak and off-peak times for all said properties in order to generate on-peak and off-peak KWH sums for each property;
      (iii) aggregating said KWH sums together across all said properties in order to produce aggregate KWH on-peak and off-peak totals, and
      (iv) identifying maximum KW demand values for all said intervals over said billing period with respect to each property, and
      (v) aggregating said KW demand values together across all said properties to produce aggregate KW demand figures for all said intervals over said billing period and identifying an aggregate KW coincident demand total across all said properties over said billing period; and
   d) reporting said KWH sums and aggregate totals together with said maximum KW values and coincident aggregate KW demand total for use in electric power usage billing processes.

2. The process of claim 1, in which:
said aggregate KW coincident demand total is based on the time of the maximum level of KW demand with respect to all the intervals over said billing period across all said properties.

3. The process of claim 1, in which:
said aggregate KW coincident demand total is based on the time of the maximum KW building wide demand for a single building in which said properties are located.

4. The process of claim 1, in which:
said aggregate KW coincident demand total is based on the time of a maximum KW system demand encompassing the multiple buildings in which said properties are located.

5. The process of claim 1, further including the steps of:
verifying the quality of the raw data by checking for missing data, zero value data and duplicate data at the time said data is received for storage, and
validating the quality of the processed KW values by load factor and out-of-bounds analysis.

6. The process of claim 2, in which:
said periodic intervals are 15 minutes long, and
said standard billing period is defined by a utility company's billing period.

7. The process of claim 3, in which:
the time of the maximum KW system demand is accessed over the internet from a utility company providing power to said properties.

8. A system for monitoring and reporting electric power usage and demand for use in conjunction with electric power billing processes, comprising:
   a) a plurality of remote electric interval power meters located at a plurality of commonly owned or leased properties for generating raw power usage and demand data including KW readings recorded with respect to periodic intervals for each of said properties;
   b) a network communications link for transmitting this raw data from said meters to a central location;
   c) a server located at said central location for storing said raw data and including an application program for processing said raw data at the end of each billing cycle by:
      (i) computing and aggregating KWH readings over said period for on-peak and off-peak times across all said properties in order to generate aggregate KWH totals, and
      (ii) computing aggregate KW demand figures over said period across all said properties and generating an aggregate KW coincident demand total across all said properties; and
   d) a computer for accessing said aggregate KWH totals and aggregate KW coincident demand total online over a network and reporting said aggregate KWH and KW totals.

9. The system of claim 8, in which:
said application program also processes said data by: computing contiguous KW readings for all said electric power meters.

10. The system of claim 9, in which:
said application program also processes said data by: synchronizing said raw data with respect to said periodic intervals and meters across all of said properties.

11. The system of claim 8, in which:
said aggregate KW coincident demand total is based on the timing of the maximum KW demand over all said properties.

12. The system of claim 8, in which:
said aggregate KW maximum coincident demand total is based on the timing of the maximum KW building wide demand for a single building in which said properties are located.

13. The system of claim 8, in which:
said aggregate KW coincident demand total is based on the timing of the maximum KW system demand for multiple buildings in which said properties are located.

14. The system of claim 8, in which:
said application program validates the quality of the processed KW values by load factor and out-of-bounds analysis.

15. The process of claim 12, in which:
the timing of the maximum KW demand for a said building in which said properties are located is accessed over the internet from a utility company providing power to the building.

16. An electric power usage monitoring and reporting process, comprising the steps of:
   a) acquiring raw power usage and demand data including KW readings recorded on periodic intervals from electric interval power meters located at a plurality of commonly owned or leased properties;
   b) transmitting and storing this raw data at a central location remote from said meters;
   c) processing said raw data over a standard billing period after the close of the billing period by:
      (i) computing KWH values from the KW values and summing KWH values over said billing period for on-peak and off-peak times for all said properties in order to generate on-peak and off-peak KWH sums for each property;
      (ii) aggregating said KWH sums together across all said properties in order to produce aggregate KWH on-peak and off-peak totals, and
      (iii) identifying maximum KW figures for all said intervals over said billing period with respect to each property, and
      (iv) aggregating said KW demand values together across all said properties to produce aggregate KW demand figures for all said intervals over said billing period and identifying an aggregate KW coincident demand total across all said properties over said billing period; and
   d) reporting said KWH sums and aggregate totals together with said maximum KW figures and coincident aggregate KW demand total for use in electric power usage billing processes.

17. The process of claim 16, in which:
said step of processing said raw data includes the sub-step of: computing contiguous KW readings for all said electric power meters.

18. The process of claim 16, in which:
said aggregate KW coincident demand total is based on the time of the maximum level of KW demand with respect to all the intervals over said billing period across all said properties.

19. The process of claim 16, in which:
said aggregate KW coincident demand total is based on the time of the maximum KW building wide demand for a single building in which said properties are located.

20. The process of claim 16, in which:
said aggregate KW coincident demand total is based on the time of a maximum KW system demand encompassing the multiple buildings in which said properties are located.

21. The process of claim 16, further including the step of:
verifying the quality of the raw data by checking for missing data, zero value data and duplicate data at the time said data is received for storage.

22. The process of claim 16, further including the step of:
validating the quality of the processed KW values by load factor and out-of-bounds analysis.

23. The process of claim 16, in which:
said periodic intervals are 15 minutes long, and
said standard billing period is defined by a utility company's billing period.

24. The process of claim 19, further including the step of:
the time of the maximum KW demand for a said building in which said properties are located is accessed over the internet from a utility company providing power to the building.

25. The process of claim 20, in which:
the time of the maximum KW system demand is accessed over the internet from a utility company providing power to said properties.

* * * * *